United States Patent [19]

Carobolante

[11] Patent Number: 5,166,544
[45] Date of Patent: Nov. 24, 1992

[54] PSEUDO DARLINGTON DRIVER ACTS AS DARLINGTON DURING OUTPUT SLEW, BUT HAS ONLY 1 $V_{BE}$ DROP WHEN FULLY TURNED ON

[75] Inventor: Francesco Carobolante, Phoenix, Ariz.

[73] Assignee: SGS-Thomson Microelectronics, Inc., Carrollton, Tex.

[21] Appl. No.: 761,729

[22] Filed: Sep. 18, 1991

[51] Int. Cl.[5] .................. H03K 3/26; H03K 17/60
[52] U.S. Cl. ........................... 307/270; 307/315; 307/570; 307/300
[58] Field of Search ............ 307/570, 315, 270, 300

[56] References Cited

U.S. PATENT DOCUMENTS

| | | | |
|---|---|---|---|
| Re. 33,378 | 10/1990 | Mehl | 307/570 |
| 4,590,395 | 5/1986 | O'Connor et al. | 307/570 |
| 4,885,486 | 12/1989 | Shekhawat et al. | 307/570 |
| 5,045,734 | 9/1991 | Mehl | 307/570 |

FOREIGN PATENT DOCUMENTS 0148466 11/1979 Japan ................... 307/315

Primary Examiner—Janice A. Howell
Assistant Examiner—Trong Phan
Attorney, Agent, or Firm—Richard A. Bachand; Lisa K. Jorgenson; Richard K. Robinson

[57] ABSTRACT

A driver circuit provides a high output current at a fast slew rate to a low impedance load. The driver circuit has an output circuit including a first bipolar transistor having a collector emitter path between a voltage supply line and a node for connection to a load. The output circuit also includes a first FET having its source-drain path connected between the voltage supply line and the base of the bipolar transistor, and its gate connected to an input node. An additional circuit supplies drive current to the base of the first bipolar transistor only to assist the first bipolar transistor turn-on, so that the additional circuit does not add extra voltage drop across the first bipolar transistor during turned on operation. In one embodiment, the first and second bipolar transistors are NPN transistors, and the first and second FETs are p-channel FET devices.

14 Claims, 1 Drawing Sheet

PSEUDO DARLINGTON DRIVER ACTS AS DARLINGTON DURING OUTPUT SLEW, BUT HAS ONLY 1 $V_{BE}$ DROP WHEN FULLY TURNED ON

BACKGROUND OF THE INVENTION

1. FIELD OF THE INVENTION

This invention relates to improvements in electronic circuits, and more particularly to improvements in electronic driver circuits of the type used for driving low impedance loads with high currents at fast slew rates.

2. DESCRIPTION OF THE PRIOR ART

In the past, circuits for providing driving voltages, for example, to low impedance loads, have been proposed. One such low impedance load application, for instance, is a multi-phase dc motor in which drive voltages are switchably applied in accordance with a commutation sequence of the stator coils of the motor. It is important in such applications to provide a driving voltage which increases to the required operating voltage as rapidly as possible in response to the input turn-on signal. (The rate at which the output voltage of the driver changes for a step-signal input is referred to herein as the "slew rate" of the driver.) The problem is exacerbated when, in addition to the normal drive voltage switching requirements, power saving techniques such as PWM techniques are employed in which the drive circuits are rapidly switched on and off during peak operating conditions in addition to their normal commutation switching. This has also been a particular problem in other applications, for example, in which the voltage across a capacitive load is required to swing in a very short time. In such applications, fast output rise and fall times are required in order to enable the proper high speed operation envisioned. However, driver circuits used in the past have not been totally successful in providing such fast slew rate requirements.

For example, a typical prior art driver circuit 10 is shown in FIG. 1. The circuit 10 includes a high gain NPN output transistor 11 and a single p-channel FET 12 pre-driver. The NPN transistor 11 has its collector connected to a supply voltage on line 15, and its emitter connected to an output node 16, which is connected in operation to the desired load. The pre-driver p-channel FET 12 has its source connected to the supply voltage on line 15, and its drain connected to the base of the NPN transistor 11. The input to the circuit 10 is applied to the gate of the p-channel FET 12 from input node 17. Usually the input signal has a step function waveform having a very rapid commutation, or falling edge time. Ideally, the waveform of the output signal delivered to the load also has a rapid rise time, tracking the input waveform; however, the capacitive elements in the circuit, notably the capacitance of the base electrode of the NPN transistor 11, need to be charged before the NPN transistor 11 can be turned on. The single p-channel FET 12, on the other hand, can only supply a fixed amount of drive current to charge the base of the transistor 11, thereby defining the rate at which the transistor 11 can be turned on, or switched into conduction.

One solution to address this problem has been to cascade additional bipolar transistors in Darlington-like configurations to achieve a higher current gain to thereby provide higher drive current to the output transistor. The problem with such solutions is that the voltage drop across the driver transistor is increased for each additional stage which is added.

SUMMARY OF THE INVENTION

In light of the above, it is therefore an object of the invention to provide a driver circuit which has a very fast slew rate.

It is another object of the invention to provide a driver circuit of the type described which does not produce multiple voltage drops across the output driver transistor in order to provide sufficient drive current for rapid operation.

It is another object of the invention to provide a driver circuit of the type described that is suitable to provide rapidly switched drive voltages to low impedance loads, such as inductive loads, capacitive loads, or the like.

It is another object of the invention to provide a driver circuit of the type described which can be realized in BiCMOS technology.

It is another object of the invention to provide a driver circuit of the type described which can easily be integrated onto a single isolated tub or well of an integrated circuit chip using BiCMOS technologies.

In a broad aspect of this invention a driver circuit is provided in which a large current gain is available when needed during a slewing condition, but without increasing the total voltage drop of the driver when fully turned on. More particularly, and in accordance with a broad aspect of the invention, a driver circuit is provided which has a high output current and fast slew rate. The circuit includes a bipolar output transistor having an output for connection to a load, and a control element responsive to drive current signals to turn the bipolar output transistor on and off. A drive circuit controls the drive current signals to the bipolar output transistor during and after the turn-on of the bipolar output transistor, and a turn-on circuit supplies drive current to the control element of the bipolar transistor only to assist the bipolar output transistor turn-on.

The drive circuit has a main drive current transistor connected to the control element of the bipolar output transistor, and has a control element connected to a driver circuit input node. The turn-on circuit has a turn-on drive current transistor with its current path connected in parallel with the main drive current transistor. The turn-on circuit also has a bias resistor connected to turn off the turn-on drive current transistor when the bipolar output transistor is turned on, whereby the turn-on drive current transistor does not drop voltage supplied by the circuit during turned on operation.

The bipolar output transistor and the turn-on drive current transistor are bipolar NPN transistors, and the main drive current transistor and the input transistor are p-channel FET devices. The transistors, therefore, can be fabricated in a single isolation well of an integrated circuit chip.

In another broad aspect of the invention, a method for providing a high output current to a low impedance load is provided. The method includes the steps of providing a bipolar output transistor having an output for connection to a load, and a control element responsive to drive current signals to turn the bipolar output transistor on and off, controlling the drive current signals to the bipolar output transistor during and after the turn-on of the bipolar output transistor, and supplying an additional drive current to the control element of the bipolar transistor to assist the bipolar output transistor turn-on.

BRIEF DESCRIPTION OF THE DRAWINGS

The invention is illustrated in the accompanying drawings, in which.

DETAILED DESCRIPTION OF THE PREFERRED EMBODIMENT

Figure 1:
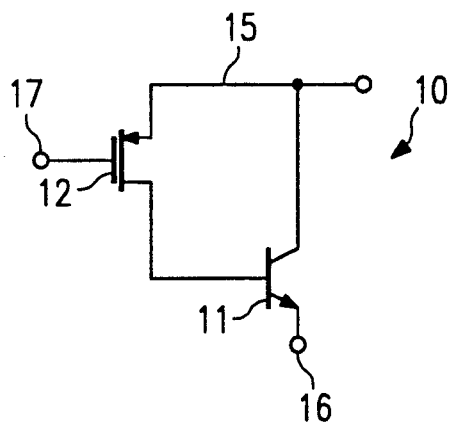
FIG. 1 is an electrical schematic diagram of a power driver circuit, in accordance with the prior art.
Figure 2:
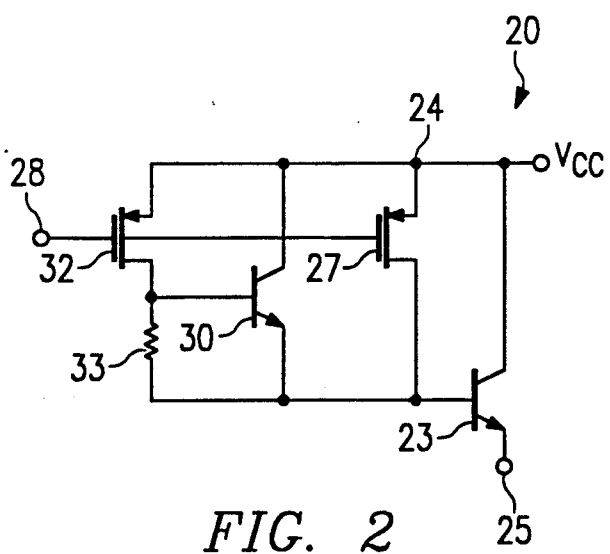
FIG. 2 is an electrical schematic diagram of a power driver circuit, in accordance with a preferred embodiment of the invention.

A driver circuit 20, in accordance with a preferred embodiment of the invention is shown schematically in FIG. 2. The circuit includes a high current output driver NPN transistor 23, having its collector connected to a line 24 to which a supply voltage, $V_{cc}$, is connected, and having its emitter connected to an output node 25 to which a load can be connected. The load (not shown) can be, for example, a low impedance load, and may include resistive, inductive, or capacitive elements, or some combination thereof. A p-channel FET 27 has its source connected to the supply voltage line 24 and its drain connected to the base of the NPN transistor 23. The gate of the p-channel FET 27 is connected to a driver circuit input node 28. The p-channel FET 27 serves as a main drive current transistor, providing a circuit to control the drive current signals to the output driver NPN transistor 23 both during and after its turn-on. The circuit described so far is similar to the circuit described above with regard to the prior art circuit of FIG. 1.

In accordance with the invention, a second NPN transistor 30, serving as a turn-on drive current transistor, is connected in a Darlington configuration in conjunction with the first NPN transistor 23, having its collector connected to the voltage supply line 24, and its emitter connected to the base of the first NPN transistor 23. A second p-channel FET 32 is provided to serve as an input transistor. The second p-channel FET 32 is of standard configuration, and operates to boost the turn-on current to the second NPN transistor 30. The second FET 32 has its source connected to the voltage supply line 24, its drain connected to the base of the second NPN transistor 30, and its gate connected to the input node 28. A high value bias resistor 33 is connected between the base and emitter of the second NPN transistor 30. The second NPN transistor 30 and the second p-channel FET 32 serve as a turn-on circuit to provide additional current drive to the output NPN transistor 23 only during its turn-on.

In operation, the circuit including the second NPN transistor 30 and the second FET 32 supplies a large turn-on current to rapidly turn-on the first NPN output driver transistor 23 in response to a rapidly decreasing input waveform, such as a step function, square wave, or the like. The second NPN transistor 30 provides a high current which charges the capacitance of the base of the output driver transistor 23, enabling its turn-on significantly faster than the prior art circuit above described. Moreover, once the output driver transistor 23 is turned on, the bias voltage between the base and the emitter of the second NPN transistor 30 is reduced, turning off the second NPN transistor 30. The second NPN transistor 30, therefore, does not contribute any voltage drop to the output of the circuit 20, the only voltage drop being the $V_{BE}$ drop produced by the output driver NPN transistor 23 plus the voltage drop between the drain and source of the FET 27. Although the second FET 23 is not turned off, its effect on the circuit 20 is minimal due to the very high value of the resistor 33 in the source drain path of the second FET 32.

When the drive voltage produced by the circuit 20 is to be turned off, the second NPN transistor 30 has already been turned off. Thus, any capacitive discharge effects due to the existence of the second NPN transistor 30 in the circuit which may otherwise exist do not adversely affect the turn off time of the circuit.

It will also be appreciated that since the circuit embodiment illustrated employs only p-channel FET devices and NPN transistors, the circuit embodiment can easily be constructed in a single isolated integrated circuit well or tub, using standard BiCMOS technologies.

It will also be appreciated by those skilled in the art that although the embodiment described uses NPN transistors and p-channel FET devices, n-channel devices, or bipolar transistors of different conductivity types can be equally advantageously employed to realize the effects of the invention.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A driver circuit having a high output current and fast slew rate, comprising:
   a bipolar output transistor having an output for connection to a load, and a control element responsive to a drive current to turn the bipolar output transistor on and off;
   a drive current FET connected to the control element of said bipolar output transistor, and having a control element connected to an input node of the driver circuit, said drive current FET being connected to control the drive current to said bipolar output transistor during and after the turn-on of said bipolar output transistor;
   a turn-on drive current bipolar transistor having a current path connected in parallel with said drive current FET for supplying drive current to the control element of said bipolar output transistor only to assist said bipolar output transistor turn-on;
   a bias resistor connected to turn off said turn-on drive current bipolar transistor when said bipolar output transistor is turned on;
   and an input FET having a current path connected to a control element of said turn-on drive transistor, said input FET having a control element connected to said input node.

2. The driver circuit of claim 1 wherein said turn-on drive current transistor and said bipolar output transistor are bipolar NPN transistors.

3. The driver circuit of claim 2 wherein said drive current FET and said input FET are p-channel devices.

4. The driver circuit of claim 3 wherein said load comprises an inductive load.

5. The driver circuit of claim 3 wherein said load comprises a capacitive load.

6. A method for providing a high output current to a low impedance load, comprising the steps of:
    providing a main drive current transistor connected to a control element of a bipolar output transistor, said main drive current transistor having a control element connected to a driver circuit input node responsive to drive current signals to turn the bipolar output transistor on and off,
    controlling the drive current signals to said bipolar output transistor during and after the turn-on of said bipolar output transistor,
    supplying an additional drive current to the control element of said bipolar output transistor to assist said bipolar output transistor turn-on by providing a turn-on drive current transistor having a current path connected in parallel with said main drive current transistor, and by supplying a bias resistor connected to turn off said turn-on drive current transistor when said bipolar output transistor is turned on; and
    providing an input transistor, said input transistor having a current path connected to a control element of said turn-on drive transistor, said input transistor having a control element connected to said input node.

7. The method of claim 6 wherein said step of providing a bipolar output transistor comprises providing a first NPN transistor, said step of providing a main drive current transistor comprises providing a first p-channel FET device, said step of providing a turn-on drive current transistor comprises providing a second NPN transistor, and said step of providing an input transistor comprises providing a second p-channel FET device.

8. The method of claim 6 further comprising providing a load comprising inductive elements.

9. The method of claim 6 further comprising providing a load comprising capacitive elements.

10. A driver circuit having a fast slew rate, comprising:
    a first bipolar transistor having an emitter for connection to a load, and a base responsive to a drive current to turn the first bipolar transistor on and off, and a collector connected to a supply voltage;
    a first FET having a drain connected to the base of said first bipolar transistor, a gate connected to an input node of the driver circuit, and a source connected to the supply voltage, said first FET controlling the drive current to said first bipolar output transistor during and after the turn-on of said first bipolar transistor;
    a second bipolar transistor having a current path connected in parallel with said first FET for supplying drive current to the base of said first bipolar transistor during turn-on of said first bipolar transistor;
    a resistor connected to bias said second bipolar transistor off when said first bipolar transistor is turned on;
    and a second FET having a current path connected to a base of said second bipolar transistor, said second FET having a gate connected to said input node.

11. The driver circuit of claim 10 wherein said first and second bipolar transistors are NPN transistors.

12. The driver circuit of claim 10 wherein said first and second FETs and p-channel devices.

13. The driver circuit of claim 10 wherein said load comprises an inductive load.

14. The driver circuit of claim 10 wherein said load comprises a capacitive load.

* * * * *